(12) United States Patent
Takahashi

(10) Patent No.: US 12,297,333 B2
(45) Date of Patent: May 13, 2025

(54) RESIN COMPOSITION FOR PROTECTIVE LAYER OF ELECTROMAGNETIC WAVE-SHIELDING FILM, ELECTROMAGNETIC WAVE-SHIELDING FILM, AND METHOD FOR PRODUCING ELECTROMAGNETIC WAVE-SHIELDING FILM

(71) Applicant: Tatsuta Electric Wire & Cable Co., Ltd., Osaka (JP)

(72) Inventor: Akio Takahashi, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 478 days.

(21) Appl. No.: 17/042,281

(22) PCT Filed: Mar. 25, 2019

(86) PCT No.: PCT/JP2019/012508
§ 371 (c)(1),
(2) Date: Sep. 28, 2020

(87) PCT Pub. No.: WO2019/188983
PCT Pub. Date: Oct. 3, 2019

(65) Prior Publication Data
US 2021/0040289 A1    Feb. 11, 2021

(30) Foreign Application Priority Data

Mar. 29, 2018  (JP) ................................. 2018-065102

(51) Int. Cl.
| C08K 3/22 | (2006.01) |
| B32B 9/04 | (2006.01) |
| H05K 1/02 | (2006.01) |
| H05K 9/00 | (2006.01) |

(52) U.S. Cl.
CPC ............... *C08K 3/22* (2013.01); *B32B 9/045* (2013.01); *H05K 1/023* (2013.01); *H05K 9/0083* (2013.01); *H05K 9/0084* (2013.01); *B32B 2457/08* (2013.01); *C08K 2003/2237* (2013.01)

(58) Field of Classification Search
None
See application file for complete search history.

(56) References Cited

U.S. PATENT DOCUMENTS

| 6,017,993 | A | * | 1/2000 | Maeda | ..................... | C08K 3/22 |
| | | | | | | 523/207 |
| 6,107,390 | A | | 8/2000 | Maeda et al. | | |

| 2014/0227529 | A1 | | 8/2014 | Yamanaka et al. | |
| 2015/0141560 | A1 | | 5/2015 | Yu et al. | |
| 2019/0160786 | A1 | * | 5/2019 | Nakagawa | ............... B32B 27/38 |
| 2021/0040289 | A1 | | 2/2021 | Takahashi | |
| 2022/0153925 | A1 | * | 5/2022 | Shimoharai | .......... C08G 63/183 |

FOREIGN PATENT DOCUMENTS

| CN | 101679617 A | 3/2010 |
| CN | 101735575 A | 6/2010 |
| CN | 102540723 A | 7/2012 |
| CN | 105579527 A | 5/2016 |
| CN | 104650546 B | 4/2017 |
| JP | H1060157 A | 3/1998 |
| JP | 2005191164 A | 7/2005 |
| JP | 2011213020 A | 10/2011 |
| JP | 5796690 B1 | 10/2015 |
| JP | 2017183465 B | 12/2016 |
| JP | 2017002323 A | 1/2017 |
| JP | 2017059708 A | 3/2017 |
| TW | M441316 U | 11/2012 |
| TW | 201318839 A | 5/2013 |
| TW | 201623383 A | 7/2016 |
| TW | M553100 U | 12/2017 |
| TW | 201942248 A | 11/2019 |
| WO | 2009044283 A3 | 5/2009 |
| WO | 2015083626 A1 | 6/2015 |
| WO | 2016036701 A1 | 3/2016 |
| WO | 2017138638 A1 | 8/2017 |
| WO | 2017170795 A1 | 10/2017 |

OTHER PUBLICATIONS

Machine translation of Hiroaki et al. WO 2017170795 (Year: 2017).*
International Search Report dated Apr. 23, 2019, issued in International Application No. PCT/JP2019/012508.

* cited by examiner

*Primary Examiner* — Robert T Butcher
(74) *Attorney, Agent, or Firm* — United IP Counselors, LLC; Kenneth M Fagin

(57) ABSTRACT

The present invention provides a resin composition for a protective layer of an electromagnetic wave shielding film, the resin composition having a long pot life and being capable of forming a white protective layer that is not easily discolored even when heated. The resin composition of the present invention is a resin composition for a protective layer of an electromagnetic wave shielding film, wherein the resin composition contains an amorphous polyester resin, a curing agent, and a white pigment, the amorphous polyester resin has a number average molecular weight Mn of less than 20000 and a glass transition temperature Tg of 40° C. or higher, and the curing agent is at least one selected from the group consisting of a blocked isocyanate, an adduct of trimethylolpropane with hexane diisocyanate, and an adduct of isocyanurate with cyclohexane diisocyanate.

8 Claims, 1 Drawing Sheet

RESIN COMPOSITION FOR PROTECTIVE LAYER OF ELECTROMAGNETIC WAVE-SHIELDING FILM, ELECTROMAGNETIC WAVE-SHIELDING FILM, AND METHOD FOR PRODUCING ELECTROMAGNETIC WAVE-SHIELDING FILM

CROSS-REFERENCE TO RELATED APPLICATIONS

This application is the U.S. National Phase of PCT application PCT/JP2019/012508 filed Mar. 25, 2019, the contents of which are incorporated herein by reference in their entirety. The PCT application, in turn, claims the priority benefit of Japanese application JP 2018-065102 filed Mar. 29, 2018, the contents of which are incorporated herein by reference in their entirety.

TECHNICAL FIELD

The present invention relates to a resin composition for a protective layer of an electromagnetic wave shielding film, an electromagnetic wave shielding film, and a method of producing an electromagnetic wave shielding film.

BACKGROUND ART

Flexible printed wiring boards are widely used to incorporate circuits into complex mechanisms of electronic devices, such as mobile phones, video cameras, and laptop computers, which are rapidly becoming smaller with higher functionality. Owing to their excellent flexibility, flexible printed wiring boards are also used to connect a movable part such as a printer head to a control unit. These electronic devices require electromagnetic wave shielding measures, and flexible printed wiring boards for use in these devices are also increasingly provided with electromagnetic wave shielding measures.

One known electromagnetic wave shielding measure is an electromagnetic wave shielding film including a protective layer made of an insulating resin and a shielding layer made of a conductive material such as metal foil.

The electromagnetic wave shielding film is attached to a flexible printed wiring board to provide an electromagnetic wave shielding measure.

In some cases, the protective layer of the electromagnetic wave shielding film is colored according to purpose.

For example, Patent Literature 1 discloses an electromagnetic wave shielding film in which the glossiness and brightness of a protective layer is adjusted by adding a black colorant to the protective layer in order to improve the visibility of the name of a manufacturer and/or the production lot number printed in white on the protective layer.

CITATION LIST

Patent Literature

Patent Literature 1: JP 5796690 B

SUMMARY OF INVENTION

Technical Problem

From an aesthetic point of view, there has been a recent demand for a white protective layer of an electromagnetic wave shielding film.

The protective layer is formed by curing a resin composition.

Thus, a white protective layer can be formed by adding a white pigment such as titanium oxide to the resin composition.

After the electromagnetic wave shielding film is attached to a flexible printed wiring board, various electronic components are further mounted on the flexible printed wiring board. In some cases, the electronic components are mounted on the flexible printed wiring board by reflow soldering. When the electronic components are mounted by reflow soldering, the whole flexible printed wiring board is heated.

When the electromagnetic wave shielding film is heated as described above, the white protective layer is turned to another color such as yellow.

There has also been a demand to increase the pot life of the resin composition prepared.

The present invention was made to solve the above problems, and aims to provide a resin composition for a protective layer of an electromagnetic wave shielding film, the resin composition having a long pot life and being capable of forming a protective layer that is not easily discolored even when heated.

Solution to Problem

Specifically, the resin composition of the present invention is a resin composition for a protective layer of an electromagnetic wave shielding film, wherein the resin composition contains an amorphous polyester resin, a curing agent, and a white pigment, the amorphous polyester resin has a number average molecular weight Mn of less than 20000 and a glass transition temperature Tg of 40° C. or higher, and the curing agent is at least one selected from the group consisting of a blocked isocyanate, an adduct of trimethylolpropane with hexane diisocyanate, and an adduct of isocyanurate with cyclohexane diisocyanate.

When an amorphous polyester resin having a number average molecular weight Mn of less than 20000 and a glass transition temperature Tg of 40° C. or higher is blended with a white pigment and cured, the cured product is white and has insulation properties.

The cured product is also not easily discolored (e.g., yellowed) even when heated.

Thus, the resin composition of the present invention is suitably used to form a protective layer that is not easily discolored even when heated.

Since the resin composition of the present invention contains an amorphous polyester resin, a cured product thereof can have a high L* value.

When an amorphous polyester resin has a number average molecular weight Mn of 20000 or more, a cured product of the amorphous polyester tends to have a higher b* value when heated.

When an amorphous polyester resin has a glass transition temperature Tg lower than 40° C., a cured product of the amorphous polyester tends to have a higher b* value when heated.

In the resin composition of the present invention, the curing agent is at least one selected from the group consisting of a blocked isocyanate, an adduct of trimethylolpropane with hexane diisocyanate, and an adduct of isocyanurate with cyclohexane diisocyanate.

These compounds are suitably used to cure the amorphous polyester resin.

When the curing agent is any of these compounds, the amorphous polyester resin can have a longer pot life.

Preferably, the resin composition of the present invention contains the curing agent in an amount of 10 to 60 parts by weight relative to 100 parts by weight of the amorphous polyester resin.

When the weight ratio is in the above range, the resin composition is cured in a suitable manner, and the cured product thereof is also not easily discolored.

Preferably, the resin composition of the present invention contains the white pigment in an amount of 70 to 300 parts by weight relative to 100 parts by weight of the amorphous polyester resin.

When the weight ratio is in the above range, the cured product of the resin composition has a desired white color.

In the resin composition of the present invention, preferably, the white pigment has an average particle size of 10 μm or less.

A white pigment having an average particle size of more than 10 μm tends to generate color unevenness.

In the resin composition of the present invention, preferably, the white pigment is at least one selected from the group consisting of titanium oxide, zinc oxide, sodium hydroxide, silica, and barium sulfate.

With the use of such a white pigment, the cured product of the resin composition can be obtained in a desired white color.

In the resin composition of the present invention, preferably, the white pigment is titanium oxide, and the titanium oxide is surface-treated with at least one selected from the group consisting of zirconia hydrate, alumina hydrate, and silicon hydrate.

When the titanium oxide is surface-treated as described above, the cured product of the resin composition is not easily discolored even when heated.

An electromagnetic wave shielding film of the present invention includes a protective layer and a shielding layer stacked on the protective layer, wherein the protective layer is a cured product of the resin composition of the present invention.

As described above, the cured product of the resin composition of the present invention is not easily discolored by heat.

The protective layer of the electromagnetic wave shielding film of the present invention is not easily discolored by heat because the protective layer is a cured product of the resin composition of the present invention.

The method of producing an electromagnetic wave shielding film of the present invention includes a protective layer forming step of applying the resin composition of the present invention to a surface of a transfer film to form a protective layer, and a shielding layer forming step of forming a shielding layer on the protective layer.

The protective layer is formed from the resin composition of the present invention, whereby an electromagnetic wave shielding film having a protective layer that is not easily discolored even when heated can be produced.

Advantageous Effects of Invention

The resin composition of the present invention contains an amorphous polyester resin having a number average molecular weight Mn of less than 20000 and a glass transition temperature Tg of 40° C. or higher.

When the amorphous polyester resin is blended with a white pigment and cured, the cured product is white and has insulation properties.

The cured product is also not easily discolored (e.g., yellowed) even when heated.

Thus, the resin composition of the present invention is suitably used to form a protective layer that is not easily discolored even when heated.

DESCRIPTION OF EMBODIMENTS

Figure 1:
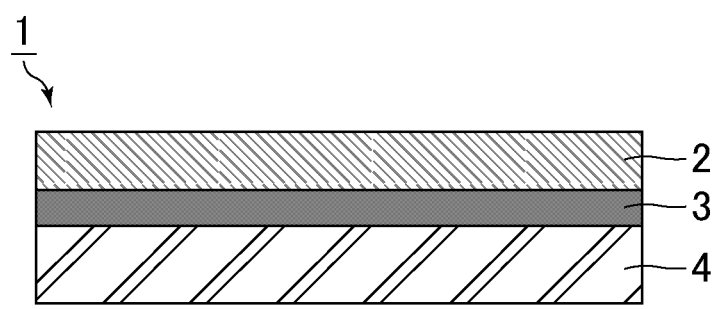
FIG. 1 is a schematic cross-sectional view of an example of an electromagnetic wave shielding film of the present invention.

A resin composition of the present invention is specifically described below. However, the present invention is not limited to the following embodiments, and can be appropriately modified without changing the gist of the invention.

The resin composition of the present invention is a resin composition for a protective layer of an electromagnetic wave shielding film, wherein the resin composition contains an amorphous polyester resin, a curing agent, and a white pigment, and the amorphous polyester resin has a number average molecular weight Mn of less than 20000 and a glass transition temperature Tg of 40° C. or higher.

The resin composition of the present invention contains an amorphous polyester resin having a number average molecular weight Mn of less than 20000 and a glass transition temperature Tg of 40° C. or higher.

When the amorphous polyester resin is blended with a white pigment and cured, the cured product is white and has insulation properties.

The cured product is also not easily discolored (e.g., yellowed) even when heated.

Thus, the resin composition of the present invention is suitably used to form a protective layer that is not easily discolored even when heated.

Components of the resin composition of the present invention are described in detail below.

(Amorphous Polyester Resin)

Since the resin composition of the present invention contains an amorphous polyester resin, a cured product thereof can have a high L* value.

In the resin composition of the present invention, the amorphous polyester resin has a number average molecular weight Mn of less than 20000. The number average molecular weight Mn of the amorphous polyester resin is preferably 10000 to 19000, more preferably 14000 to 18000.

When an amorphous polyester resin has a number average molecular weight Mn of 20000 or more, a cured product of the amorphous polyester resin tends to have a higher b* value when heated.

An amorphous polyester resin having a number average molecular weight Mn of less than 10000 results in low cohesive strength, making it difficult to form a film.

The number average molecular weight Mn of the amorphous polyester resin can be measured by gel permeation chromatography (GPC) using tetrahydrofuran as the mobile phase, and calculated using a polystyrene-based calibration curve.

In the resin composition of the present invention, the amorphous polyester resin has a glass transition temperature Tg of 40° C. or higher. Preferably, the amorphous polyester resin has a glass transition temperature Tg of 40° C. to 100° C., more preferably 60° C. to 85° C.

When an amorphous polyester resin has a glass transition temperature Tg lower than 40° C., a cured product of the amorphous polyester resin tends to have a higher b* value when heated. An amorphous polyester resin having a glass transition temperature Tg higher than 100° C. results in low flexibility, making it difficult to form a film.

Herein, the glass transition temperature Tg of the amorphous polyester resin can be calculated by the following method.

First, 5 mg of a measurement sample is weighed into an aluminum pan of a differential scanning calorimeter (e.g., a product name "DSC 220" available from Seiko Instruments Inc.), and the alumina pan is sealed by pressing a lid. Next, the sample is maintained at 220° C. for 5 minutes to be completely melted, and is then rapidly cooled with liquid nitrogen, followed by heating from −150° C. to 250° C. at a heating rate of 20° C./min. Data obtained are plotted to generate a curve in a coordinate plane, with the heating time on the horizontal axis and the sample temperature on the vertical axis. An inflection point of the curve is taken as the glass transition temperature Tg.

(Curing Agent)

The resin composition of the present invention contains a curing agent that cures the amorphous polyester resin.

The curing agent is at least one selected from the group consisting of a blocked isocyanate, an adduct of trimethylolpropane with hexane diisocyanate, and an adduct of isocyanurate with cyclohexane diisocyanate.

Examples of the adduct of trimethylolpropane with hexane diisocyanate include an adduct of trimethylolpropane with hexane-1,6-diisocyanate.

Examples of the adduct of isocyanurate with cyclohexane diisocyanate include an adduct of isocyanurate with 1,3-bis(isocyanatomethyl)cyclohexane.

These compounds are suitably used to cure the amorphous polyester resin.

When the curing agent is any of these compounds, the amorphous polyester resin can have a longer pot life.

Preferably, the resin composition of the present invention contains the curing agent in an amount of 10 to 60 parts by weight, more preferably 20 to 55 parts by weight, relative to 100 parts by weight of the amorphous polyester resin.

When the weight ratio is in the above range, the resin composition is cured in a suitable manner, and the cured product of the resin composition is also not easily discolored.

(White Pigment)

The resin composition of the present invention contains a white pigment. Thus, when the resin composition of the present invention is cured to form a protective layer, a white protective layer can be obtained.

In the resin composition of the present invention, the white pigment is not limited. Examples include titanium oxide, zinc oxide, sodium hydroxide, silica, barium sulfate, talc, mica, glassflake, boron nitride (BN), calcium carbonate, aluminum hydroxide, titanate (e.g., potassium titanate), barium sulfate, alumina, kaolin, clay, titanium oxide, zinc oxide, zinc sulfide, lead titanate, zircon oxide, antimony oxide, and magnesium oxide.

Of these, the white pigment is preferably at least one selected from the group consisting of titanium oxide, zinc oxide, sodium hydroxide, silica, and barium sulfate, and is more preferably titanium oxide.

With the use of such a white pigment, the cured product of the resin composition can be obtained in a desired white color.

In the resin composition of the present invention, when the white pigment is titanium oxide, preferably, the titanium oxide is surface-treated with zirconia hydrate, alumina hydrate, silicon hydrate, a silicone compound (a silane coupling agent), a polyhydric alcohol compound, an amine compound, a fatty acid, a fatty acid ester, or the like.

Of these, the titanium oxide is more preferably surface-treated with at least one selected from the group consisting of zirconia hydrate, alumina hydrate, and silicon hydrate.

When the titanium oxide is surface-treated as described above, the cured product of the resin composition is not easily discolored even when heated.

Preferably, the resin composition of the present invention contains the white pigment in an amount of 70 to 300 parts by weight, more preferably 100 to 250 parts by weight, relative to 100 parts by weight of the amorphous polyester resin.

When the weight ratio is in the above range, the cured product of the resin composition has a desired white color.

In the resin composition of the present invention, the white pigment preferably has an average particle size of 10 μm or less, more preferably 0.1 to 5 μm.

A white pigment having an average particle size of more than 10 μm tends to generate color unevenness.

A white pigment having an average particle size of less than 0.1 μm tends to cause particle cohesion, likely resulting in poor dispersion and color unevenness.

Herein, the average particle size of the white pigment is the average particle size $D_{50}$ (median diameter) based on the number of particles, measured by the laser diffraction scattering method.

(Other Additives)

The resin composition of the present invention may further contain additives such as curing accelerators, tackifiers, antioxidants, pigments, dyes, plasticizers, ultraviolet light absorbers, defoamers, leveling agents, fillers, flame retardants, viscosity modifiers, and anti-blocking agents.

As described later, the resin composition of the present invention is cured to form a protective layer of an electromagnetic wave shielding film.

The electromagnetic wave shielding film is bonded to a printed wiring board by thermal compression. Electronic components are mounted by reflow soldering on the printed wiring board having the electromagnetic wave shielding film thereon.

This means that the cured product of the resin composition of the present invention is heated several times.

The impact of heating on the cured product of the resin composition of the present invention can be observed by modeling as described in "Reflow soldering test" below.

(Reflow Soldering Test)

(1) Protective Layer Forming Step

A polyethylene terephthalate film whose one side was subjected to release treatment is prepared as a first release film.

The resin composition of the present invention is applied to the release-treated side of the first release film, and heated at 100° C. for 3 minutes in an electric oven to produce a 10-μm thick protective layer (a cured product of the resin composition).

(2) Adhesive Layer Forming Step

A polyethylene terephthalate film whose one side was subjected to release treatment is prepared as a second release film.

An epoxy resin is applied to the release-treated side of the second release film, and heated at 100° C. for 2 minutes in an electric oven to produce a 15-μm thick adhesive layer.

(3) Model Film Producing Step

The protective layer formed on the first release film is bonded to the adhesive layer formed on the second release film to produce a model film.

(4) Thermal Compression Bonding Step

A model substrate made of a polyimide resin is prepared. The second release film is released from the model film, and the model film is placed on the model substrate, with the adhesive layer of the model film on the model substrate.

Subsequently, the model film is bonded to the model substrate by thermal compression at 3 MPa and 170° C. for 180 seconds. Then, the first release film is released.

Hereinbelow, the cured product of the resin composition of the present invention after this step is referred to as "the cured product of the resin composition before reflow soldering".

(Reflow Soldering Step)

The model substrate having the model film attached thereto is left to stand until it is cooled to room temperature.

Subsequently, the model substrate is heated at 265° C. for 30 seconds.

This step is performed five times in total.

Hereinbelow, the cured product of the resin composition of the present invention after the n-th heating is referred to as "the cured product of the resin composition after the n-th reflow soldering".

In the reflow soldering test, preferably, the cured product of the resin composition before reflow soldering has an $L^*$ value of 90 or higher.

In the reflow soldering test, preferably, the cured product of the resin composition after the fifth reflow soldering has an $L^*$ value of 90 or higher.

When the parameter of the $L^*$ value is as described above, it means that the cured product of the resin composition of the present invention is not easily discolored by heat.

Herein, the $L^*$ value is a value measured according to the method specified in JIS Z 8730:2009.

In the reflow soldering test, preferably, the cured product of the resin composition before reflow soldering has a $b^*$ value of 0 or lower.

In the reflow soldering test, preferably, the cured product of the resin composition after the fifth reflow soldering has a $b^*$ value of 1 or lower.

When the parameter of the $b^*$ value is as described above, it means that the cured product of the resin composition of the present invention is not easily discolored by heat.

Herein, the $b^*$ value is a value measured according to the method specified in JIS Z 8730:2009.

In the reflow soldering test, preferably, the value of color difference $\Delta E^*ab$ between the cured product of the resin composition before reflow soldering and the cured product of the resin composition after the fifth reflow soldering is 2.5 or lower.

When the value of color difference $\Delta E^*ab$ before and after reflow soldering is as described above, it means that the cured product of the resin composition of the present invention is not easily discolored by heat.

Herein, the "value of color difference $\Delta E^*ab$" is a value calculated from $L^*$ value, $a^*$ value, and $b^*$ value measured according to the method specified in JIS Z 8730:2009.

In the reflow soldering test, preferably, the cured product of the resin composition before reflow soldering has a glossiness at 60° of 25 or lower.

Further, in the reflow soldering test, preferably, the resin composition after the fifth reflow soldering has a glossiness at 60° of 25 or lower.

When the parameter of the glossiness is as described above, it means that the cured product of the resin composition of the present invention maintains its shape without being melted by heat.

Herein, the "glossiness at 60°" is a value measured according to the method specified in JIS Z 8741:1997.

Next, an electromagnetic wave shielding film of the present invention formed from the resin composition of the present invention is described.

FIG. 1 is a schematic cross-sectional view of an example of an electromagnetic wave shielding film of the present invention.

As shown in FIG. 1, an electromagnetic wave shielding film 1 includes a protective layer 2, a shielding layer 3 stacked on the protective layer 2, and an adhesive layer 4 stacked on the shielding layer 3.

Each component of the electromagnetic wave shielding film 1 is described in detail below.

(Protective Layer)

The protective layer 2 shown in FIG. 1 is a cured product of the resin composition of the present invention.

As described above, the cured product of the resin composition of the present invention is not easily discolored by heat. Thus, the protective layer that is a cured product of the resin composition of the present invention is also not easily discolored by heat.

Since the cured product of the resin composition of the present invention has insulation properties, the protective layer 2 also functions as an insulating layer.

(Shielding Layer)

The shielding layer 3 may be made of any material having electromagnetic wave shield properties. For example, the shielding layer 3 may be made of a metal layer or a conductive adhesive layer.

When the shielding layer 3 is a metal layer, the shielding layer 3 may include a layer made of a material such as gold, silver, copper, aluminum, nickel, tin, palladium, chromium, titanium, or zinc, and preferably includes a copper layer.

Copper is a material suitable for the shielding layer 3 in terms of conductivity and economic efficiency.

The shielding layer 3 may include a layer made of an alloy of the above metals.

When the shielding layer 3 is a conductive adhesive layer, the shielding layer 3 may be made of a conductive filler and an adhesive resin.

The conductive filler is not limited. Preferred examples include silver powder, copper powder, nickel powder, solder powder, aluminum powder, silver-coated copper powder (silver-plated copper powder), and fine particles (such as polymer fine particles and glass beads) coated with metal.

The adhesive resin is not limited. Examples include thermoplastic resin compositions such as styrene resin compositions, vinyl acetate resin compositions, polyester resin compositions, polyethylene resin compositions, polypropylene resin compositions, imide resin compositions, amide resin compositions, and acrylic resin compositions; and thermosetting resin compositions such as phenolic resin compositions, epoxy resin compositions, urethane resin compositions, melamine resin compositions, and alkyd resin compositions.

The electromagnetic wave shielding film 1 may include an anchor coat layer between the protective layer 2 and the shielding layer 3.

Examples of the material of the anchor coat layer include urethane resins, acrylic resins, core-shell composite resins containing a urethane resin as the shell and an acrylic resin as the core, epoxy resins, imide resins, amide resins, melamine resins, phenolic resins, urea formaldehyde resins, blocked isocyanates obtained by reacting polyisocyanate with a blocking agent such as phenol, polyvinyl alcohol, and polyvinylpyrrolidone.

(Adhesive Layer)

The adhesive layer 4 may be made of any material that allows the electromagnetic wave shielding film 1 to bond to a printed wiring board.

The material may be an adhesive resin. Examples include thermoplastic resin compositions such as styrene resin compositions, vinyl acetate resin compositions, polyester resin compositions, polyethylene resin compositions, polypropylene resin compositions, imide resin compositions, amide resin compositions, and acrylic resin compositions; and thermosetting resin compositions such as phenolic resin compositions, epoxy resin compositions, urethane resin compositions, melamine resin compositions, and alkyd resin compositions.

The adhesive layer 4 may have conductivity.

In this case, preferably, the adhesive layer 4 is made of the above adhesive resin and a conductive filler.

The conductive filler is not limited. Preferred examples include silver powder, copper powder, nickel powder, solder powder, aluminum powder, silver-coated copper powder (silver-plated copper powder), and fine particles (such as polymer fine particles and glass beads) coated with metal.

The electromagnetic wave shielding film 1 can be produced by applying the resin composition of the present invention to a surface of a transfer film to form the protective layer 2 (protective layer forming step), forming the shielding layer 3 made of the above materials on the protective layer 2 (shielding layer forming step), and forming the adhesive layer 4 made of the above materials on the shielding layer 3 (adhesive layer forming step).

Next, another example of the electromagnetic wave shielding film of the present invention is described.

Figure 2:
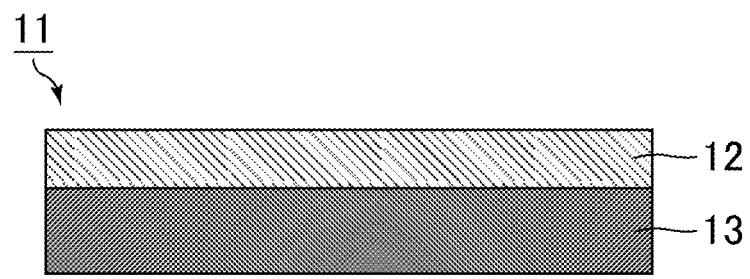
FIG. 2 is a schematic cross-sectional view of another example of the electromagnetic wave shielding film of the present invention.

FIG. 2 is a schematic cross-sectional view of another example of the electromagnetic wave shielding film of the present invention.

As shown in FIG. 2, an electromagnetic wave shielding film 11, which is an example of the electromagnetic wave shielding film of the present invention, may include a protective layer 12 and a shielding layer 13 stacked on the protective layer 12.

In the electromagnetic wave shielding film 11, similar to the protective layer 2, the protective layer 12 is a cured product of the resin composition of the present invention.

In the electromagnetic wave shielding film 11, the shielding layer 13 is a conductive adhesive layer.

This means that the shielding layer 13 has electromagnetic wave shielding properties and adhesiveness.

Thus, unlike the electromagnetic wave shielding film 1, the electromagnetic wave shielding film 11 can adhere to a printed wiring board without the need of forming the adhesive layer 4.

Preferably, the shielding layer 13 is made of a conductive filler and an adhesive resin.

The conductive filler is not limited. Preferred examples include silver powder, copper powder, nickel powder, solder powder, aluminum powder, silver-coated copper powder (silver-plated copper powder), and fine particles (such as polymer fine particles and glass beads) coated with metal.

The adhesive resin is not limited. Examples include thermoplastic resin compositions such as styrene resin compositions, vinyl acetate resin compositions, polyester resin compositions, polyethylene resin compositions, polypropylene resin compositions, imide resin compositions, amide resin compositions, and acrylic resin compositions; and thermosetting resin compositions such as phenolic resin compositions, epoxy resin compositions, urethane resin compositions, melamine resin compositions, and alkyd resin compositions.

The electromagnetic wave shielding film 11 can be produced by applying the resin composition of the present invention to a surface of a transfer film to form the protective layer 12 (protective layer forming step), and forming the shielding layer 13 made of the above materials on the protective layer 12 (shielding layer forming step).

EXAMPLES

The present invention is more specifically described below with reference to examples, but the present invention is not limited to these examples.

Examples 1 to 7 and Comparative Examples 1 to 7

As shown in Table 1, a resin, a curing agent, and a white pigment were mixed together to produce resin compositions according to Examples 1 to 7 and Comparative Examples 1 to 7.

The numerical values for the compositions in Table 1 indicate "parts by weight".

The following materials were used for the resins, curing agents, and white pigments in Table 1.

Amorphous polyester resin 1: UE3200 available from Unitika Ltd. (Mn=16000; Tg=65° C.)

Amorphous polyester resin 2: UE3215 available from Unitika Ltd. (Mn=16000; Tg=45° C.)

Amorphous polyester resin 3: UE9800 available from Unitika Ltd. (Mn=13000; Tg=85° C.)

Amorphous polyester resin 4: UE3210 available from Unitika Ltd. (Mn=20000; Tg=45° C.)

Amorphous polyester resin 5: LP-035 available from The Nippon Synthetic Chemical Industry Co., Ltd. (Mn=16000; Tg=20° C.)

Epoxy resin: jER4275 (bisphenol A epoxy resin solid at room temperature (8500 g/eq)) available from Mitsubishi Chemical Corporation Blocked isocyanate: SBN-70D available from Asahi Kasei Corporation $H_6$XDI/isocyanurate (adduct of isocyanurate with 1,3-bis (isocyanatomethyl)cyclohexane): Takenate D-127N available from Mitsui Chemicals, Inc.

HDI/adduct (adduct of trimethylolpropane with hexane-1,6-diisocyanate): Takenate D-160N available from Mitsui Chemicals, Inc.

HDI/isocyanurate 1: Takenate D-170N available from Mitsui Chemicals, Inc.

HDI/isocyanurate 2: Takenate D-170HN available from Mitsui Chemicals, Inc.

PDI/isocyanurate: STABiO D-370N available from Mitsui Chemicals, Inc.

XDI/isocyanurate: Takenate D-131N available from Mitsui Chemicals, Inc.

Titanium oxide 1: R-62N available from Sakai Chemical Industry Co., Ltd.

Titanium oxide 2: D-918 available from Sakai Chemical Industry Co., Ltd.

(Pot Life Test)

After the resin compositions according to the examples and the comparative examples were prepared, these resin compositions were left at room temperature (25° C.), and the time taken by these resin compositions to solidify was checked by visual observation.

Table 1 shows the results.

(Reflow Soldering Test)

The resin compositions of the examples and the comparative examples were subjected to the reflow soldering test by the method described above.

The L* value, a* value, b* value, and glossiness at 60° of the cured products of the resin compositions before reflow soldering and after the first, third, and fifth reflow soldering were measured. The value of color difference ΔE*ab between the cured product of the resin composition before reflow soldering and the cured product of the resin composition after the fifth reflow soldering was calculated.

Table 1 shows the results.

As shown in Table 1, in each of the cured products of the resin compositions according to Examples 1 to 7, the color difference ΔE*ab between the cured product of the resin composition before reflow soldering and the cured product of the resin composition after the fifth reflow soldering was small. In other words, the cured products of the resin compositions according to Examples 1 to 7 were not easily discolored by heat.

In particular, when the curing agent was an adduct of isocyanurate with 1,3-bis(isocyanatomethyl)cyclohexane or an adduct of trimethylolpropane with hexane-1,6-diisocyanate as in Examples 6 and 7, the glossiness at 60° was maintained at a low level throughout the reflow soldering tests from before reflow soldering to after the fifth reflow soldering.

As shown in Table 1, when the amorphous polyester resin had a number average molecular weight Mn of 20000 as in the cured product of the resin composition according to Comparative Example 1, the b* value easily increased along an increase in the number of times of reflow soldering.

As shown in Table 1, when the amorphous polyester resin had a glass transition temperature Tg of 20° C. as in the cured product of the resin composition according to Comparative Example 2, the b* value easily increased along an increase in the number of times of reflow soldering.

As shown in Table 1, when the resin was an epoxy resin as in the cured product of the resin composition according to Comparative Example 3, the L* value was already low before reflow soldering.

The b* value easily increased along an increase in the number of times of reflow soldering.

As shown in Table 1, when the curing agent was not a blocked isocyanate, an adduct of isocyanurate with 1,3-bis(isocyanatomethyl)cyclohexane, or an adduct of trimethylolpropane with hexane-1,6-diisocyanate as in Comparative Examples 4 to 7, the pot life was short.

REFERENCE SIGNS LIST 1, 11 electromagnetic wave shielding film
2, 12 protective layer
3, 13 shielding layer
4 adhesive layer

APPENDIX TO SPECIFICATION

| Composition | | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|---|---|---|---|---|---|---|
| Resin | Amorphous polyester resin 1 (Mn = 16000; Tg = 65° C.) | 100 | — | — | — | — | — | — | — | — | — | — | — | — | — |
| | Amorphous polyester resin 2 (Mn = 16000; Tg = 45° C.) | — | 100 | — | — | — | — | — | — | — | — | — | — | — | — |
| | Amorphous polyester resin 3 (Mn = 16000; Tg = 45° C.) | — | — | 100 | — | — | — | 100 | — | — | — | — | — | — | — |
| | Amorphous polyester resin 3 (Mn = 13000; Tg = 85° C.) | — | — | — | 100 | — | — | — | 100 | — | — | — | — | — | — |
| | Amorphous polyester resin 4 (Mn = 20000; Tg = 45° C.) | — | — | — | — | 100 | 100 | — | — | — | — | 100 | 100 | 100 | 100 |
| | Amorphous polyester resin 5 (Mn = 16000; Tg = 20° C.) | — | — | — | — | — | — | — | — | 100 | — | — | — | — | — |
| | Epoxy resin | — | — | — | — | — | — | — | — | — | 100 | — | — | — | — |
| White pigment | Titanium oxide 1 | 150 | 150 | 150 | 150 | 150 | 150 | 150 | 150 | 150 | 150 | 150 | 150 | 150 | 150 |
| | Titanium oxide 2 | — | — | — | — | — | — | — | — | — | — | — | — | — | — |
| Curing agent | Blocked isocyanate | 50 | 50 | 25 | 30 | 50 | 15 | 16.5 | 20 | 40 | — | 9 | 8.5 | 15 | 9 |
| | H₆XDI/isocyanurate | — | — | — | — | — | — | — | — | — | — | — | — | — | — |
| | HDI/adduct | — | — | — | — | — | — | — | — | — | — | — | — | — | — |
| | HDI/isocyanurate 1 | — | — | — | — | — | — | — | — | — | — | — | — | — | — |
| | HDI/isocyanurate 2 | — | — | — | — | — | — | — | — | — | — | — | — | — | — |
| | PDI/isocyanurate | — | — | — | — | — | — | — | — | — | — | — | — | — | — |
| | XDI/isocyanurate | — | — | — | — | — | — | — | — | — | — | — | — | — | — |
| Pot life | | 48 hours or longer | 48 hours or longer | 48 hours or longer | 48 hours or longer | 48 hours or longer | 48 hours or longer | 48 hours or longer | 48 hours or longer | 48 hours or longer | 48 hours or longer | 5 hours | 2 hours | 6 hours | 10 hours |

| Reflow soldering test | | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|---|---|---|---|---|---|---|
| $L^*$ value | Before reflow soldering | 93.68 | 94.61 | 94.60 | 94.03 | 89.81 | 91.13 | 92.00 | 94.22 | 94.45 | 88.75 | 92.45 | 91.86 | 91.22 | 91.23 |
| | 1st reflow soldering | 93.11 | 94.25 | 94.57 | 93.83 | 89.80 | 91.36 | 92.14 | 94.14 | 94.34 | 87.88 | 91.99 | 92.05 | 91.19 | 91.56 |
| | 3rd reflow soldering | 93.07 | 94.19 | 94.54 | 93.81 | 89.93 | 91.19 | 92.04 | 93.92 | 94.19 | 86.16 | 92.11 | 91.82 | 90.92 | 91.38 |
| | 5th reflow soldering | 92.96 | 94.17 | 94.56 | 93.63 | 89.74 | 91.35 | 91.60 | 93.59 | 93.99 | 84.50 | 92.21 | 91.51 | 90.45 | 90.92 |
| $a^*$ value | Before reflow soldering | −0.89 | −0.87 | −0.91 | −1.53 | −1.90 | −1.85 | −1.84 | −1.57 | −1.56 | −1.82 | −1.80 | −1.83 | −1.80 | −1.90 |
| | 1st reflow soldering | −1.08 | −1.00 | −0.97 | −1.64 | −1.93 | −1.89 | −1.88 | −1.71 | −1.67 | −1.88 | −1.88 | −1.84 | −1.84 | −1.93 |
| | 3rd reflow soldering | −1.17 | −1.09 | −1.06 | −1.76 | −1.96 | −1.96 | −1.93 | −1.84 | −1.79 | −1.92 | −1.90 | −1.90 | −1.87 | −1.97 |
| | 5th reflow soldering | −1.21 | −1.14 | −1.10 | −1.84 | −1.97 | −2.01 | −2.00 | −1.84 | −1.81 | −1.95 | −1.93 | −1.94 | −1.91 | −2.01 |
| $b^*$ value | Before reflow soldering | −1.31 | −1.13 | −1.31 | −1.20 | −3.84 | −3.49 | −3.03 | −1.05 | −1.15 | −3.83 | −2.74 | −2.99 | −3.21 | −3.44 |
| | 1st reflow soldering | −0.89 | −0.78 | −1.07 | −0.64 | −3.65 | −3.14 | −2.72 | 0.33 | −0.44 | 0.59 | −2.84 | −2.73 | −3.08 | −3.08 |
| | 3rd reflow soldering | 0.07 | 0.30 | −0.42 | 0.04 | −1.96 | −2.92 | −2.59 | 1.73 | 0.68 | 4.69 | −2.61 | −2.67 | −3.13 | −3.02 |
| | 5th reflow soldering | 0.66 | 0.77 | 0.20 | 0.79 | −1.97 | −2.62 | −2.45 | 2.86 | 1.46 | 7.96 | −2.18 | −2.57 | −3.25 | −3.09 |
| Value of color difference $\Delta E^*ab$ before and after reflow soldering | | 0.61 | 0.47 | 0.62 | 2.05 | 0.35 | 0.91 | 0.72 | 3.97 | 2.66 | 12.53 | 0.63 | 0.46 | 0.77 | 0.47 |
| Glossiness at 60° | Before reflow soldering | 19.3 | 19.4 | 9.5 | 21.0 | 66.2 | 13.9 | 11.2 | 24.6 | 32.0 | 16.5 | 11.0 | 10.9 | 10.6 | 10.7 |
| | 1st reflow soldering | 83.9 | 86.5 | 86.0 | 59.1 | 82.3 | 16.4 | 11.3 | 59.0 | 93.3 | 21.5 | 11.4 | 11.0 | 10.8 | 10.4 |
| | 3rd reflow soldering | 84.2 | 81.5 | 84.6 | 70.0 | 85.0 | 20.1 | 12.1 | 57.7 | 92.5 | 26.5 | 12.0 | 11.6 | 11.1 | 11.5 |
| | 5th reflow soldering | 81.5 | 78.9 | 83.2 | 77.9 | 84.8 | 23.2 | 12.9 | 59.2 | 91.2 | 27.2 | 12.3 | 12.0 | 11.5 | 11.9 |

The invention claimed is:

1. An electromagnetic wave shielding film, comprising:
a protective layer; and
a shielding layer stacked on the protective layer,
wherein the protective layer is a white, cured product of
a resin composition comprising
an amorphous polyester resin;
a curing agent; and
a white pigment;
wherein the amorphous polyester resin has a number average molecular weight Mn of less than 20000 and a glass transition temperature Tg of 40° C. or higher;
the curing agent is at least one selected from the group consisting of a blocked isocyanate, an adduct of trimethylolpropane with hexane diisocyanate, and an adduct of isocyanurate with cyclohexane diisocyanate;
the resin composition contains the white pigment in an amount of 70 to 300 parts by weight relative to 100 parts by weight of the amorphous polyester resin; and
the white pigment is at least one selected from the group consisting of titanium oxide, zinc oxide, sodium hydroxide, silica, barium sulfate, talc, mica, glassflake, boron nitride, calcium carbonate, aluminum hydroxide, titanate, barium sulfate, alumina, kaolin, clay, zinc sulfide, lead titanate, zircon oxide, antimony oxide, and magnesium oxide.

2. A method of producing an electromagnetic wave shielding film, comprising:
a protective-layer-forming step of applying a resin composition to a surface of a transfer film to form a white protective layer; and
a shielding-layer-forming step of forming a shielding layer on the protective layer,
wherein the resin composition comprises
an amorphous polyester resin;
a curing agent; and
a white pigment;
wherein the amorphous polyester resin has a number average molecular weight Mn of less than 20000 and a glass transition temperature Tg of 40° C. or higher;
the curing agent is at least one selected from the group consisting of a blocked isocyanate, an adduct of trimethylolpropane with hexane diisocyanate, and an adduct of isocyanurate with cyclohexane diisocyanate;
the resin composition contains the white pigment in an amount of 70 to 300 parts by weight relative to 100 parts by weight of the amorphous polyester resin; and
the white pigment is at least one selected from the group consisting of titanium oxide, zinc oxide, sodium hydroxide, silica, barium sulfate, talc, mica, glassflake, boron nitride, calcium carbonate, aluminum hydroxide, titanate, barium sulfate, alumina, kaolin, clay, zinc sulfide, lead titanate, zircon oxide, antimony oxide, and magnesium oxide.

3. The electromagnetic wave shielding film according to claim 1, wherein the resin composition contains the curing agent in an amount of 10 to 60 parts by weight relative to 100 parts by weight of the amorphous polyester resin.

4. The electromagnetic wave shielding film according to claim 1, wherein the white pigment has an average particle size of 10 μm or less.

5. The electromagnetic wave shielding film according to claim 1, wherein the white pigment is at least one selected from the group consisting of titanium oxide, zinc oxide, sodium hydroxide, silica, and barium sulfate.

6. The electromagnetic wave shielding film according to claim 1, wherein the white pigment is titanium oxide, and the titanium oxide is surface-treated with at least one selected from the group consisting of zirconia hydrate, alumina hydrate, and silicon hydrate.

7. The electromagnetic wave shielding film according to claim 1, wherein the time taken by the resin composition to solidify is 48 hours or longer when the resin composition is left at a temperature of 25° C. after preparation.

8. The method of producing an electromagnetic wave shielding film according to claim 2, wherein the time taken by the resin composition to solidify is 48 hours or longer when the resin composition is left at a temperature of 25° C. after preparation.

* * * * *